United States Patent [19]

Nakao et al.

[11] Patent Number: 4,758,689
[45] Date of Patent: Jul. 19, 1988

[54] CARD-TYPE THIN ELECTRONIC DEVICE

[75] Inventors: Kazuhiro Nakao; Yoshinori Oogita; Shigeki Komaki; Kazuhito Ozawa; Katsuhide Shino, all of Nara, Japan

[73] Assignee: Sharp Kabushiki Kaisha, Osaka, Japan

[21] Appl. No.: 893,935

[22] Filed: Aug. 6, 1986

[30] Foreign Application Priority Data

Aug. 9, 1985 [JP] Japan .............................. 60-123083[U]

[51] Int. Cl.[4] ........................ H05K 5/06; H05K 13/04
[52] U.S. Cl. ..................... 174/52 S; 156/625; 174/52 R; 174/52 P; 53/591; 211/41; 206/328; 206/331; 206/329; 206/334
[58] Field of Search ................ 156/345, 625; 211/41; 206/328, 331, 329, 334; 53/591; 428/35; 174/52 S, 52 R, 52 P

[56] References Cited

U.S. PATENT DOCUMENTS

| 2,713,700 | 7/1955 | Fisher | 174/52 S |
| 3,591,432 | 7/1971 | Vazirani | 156/629 |
| 3,906,144 | 9/1975 | Wiley | 174/52 S |
| 3,971,193 | 7/1976 | Tardiff et al. | 53/591 |
| 4,043,094 | 8/1977 | Bohannon, Jr. | 53/591 |
| 4,092,664 | 5/1978 | Davis, Jr. | 174/52 S |
| 4,159,221 | 6/1979 | Schuessler | 174/52 S |
| 4,252,990 | 2/1981 | Sado | 174/52 R |
| 4,483,441 | 11/1984 | Akizawa et al. | 206/334 |
| 4,564,880 | 1/1986 | Christ et al. | 206/334 |

Primary Examiner—Kenneth M. Schor
Assistant Examiner—Lori-Ann Cody
Attorney, Agent, or Firm—Birch, Stewart, Kolasch & Birch

[57] ABSTRACT

A card-type thin electronic device in which the upper and lower panels are bonded to flanges projecting from a side-wall forming frame between the two panels, while a number of grooves are formed by a half-etching process on the surfaces of both panels bonded against the side-wall forming frame.

5 Claims, 1 Drawing Sheet

CARD-TYPE THIN ELECTRONIC DEVICE

BACKGROUND OF THE INVENTION

The present invention relates to a card-type thin electronic device approximately 0.8 mm thick. It is generally comparable to the standard credit-card size, and more particularly, with the package arrangement made up of upper and lower panels and a frame for internally mounting a variety of electronic components to make up a complete thin-type electronic device.

As shown in FIG. 3 of the appended drawings, the conventional package arrangement of a thin electronic device is composed of a pair of stainless-steel upper and lower panels 1 and 2. These are bonded with a polyamid bonding agent, for example, to a flange 4 projecting out from the internal surface of a frame 3, which makes up the lateral walls.

The thin constitution of such electronic devices requires a high bending strength. To achieve this, the upper and lower panels 1 and 2 are made of material with an adequate ability to withstand tensile and compressive forces. The panels 1 and 2 are bonded to a frame 3 using a bonding agent with adequate elasticity. These two measures ensure the necessary bending strength. Conventionally, in the light of operating efficiency, a sheet-like thermoplastic bonding agent 5 is used. However, there is a limited availability of sheet-like thermoplastic bonding agents with adequate elasticity. Thus depending on the type of materials used for the upper and lower panels 1 and 2 and the frame 3 to be bonded together, satisfactory bonding often cannot be achieved. Consequently, the postions of these panels 1 and 2 occasionally deviate when a bending force is applied. Furthermore, to improve the bond, a primer conventionally is applied to the surfaces of the panels 1 and 2 to be bonded. Factory employees usually perform this primer-coating operation manually, thus, the complicated production processes eventually result in higher costs. In addition, unless a proper amount of the bonding agent is applied, the agent itself may leak outside of the assembled product.

SUMMARY OF THE INVENTION

The present invention effectively elimates those problems inherent in the conventional techniques mentioned above by providing a card-type thin electronic device featuring an extremely simplified constitution. This design allows for a sufficient bonding force to be generated without the need for a special treatment on the surface of the component panels to be bonded together and without the risk of the bonding agent leaking out of the bonded panels.

In brief, to achieve the objectives mentioned above, the present invention provides a novel constitution in which grooves are formed by a half-etching process in the surface of the upper and lower panels to be bonded against the frame. The upper and lower panels are then bonded to flanges that project out from the wall-forming frame between the panels.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 3:
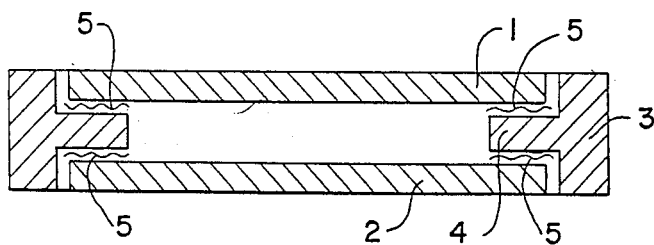
FIG. 3 is a vertical sectional view of a conventional card-type thin electronic device.

Referring now to the appended drawings, one of the preferred embodiments of the present invention is described below. Note that the component parts shown in FIG. 1 equivalent to those shown in FIG. 3 have identical reference numerals. Grooves 6 are formed by a half-etching process in the surfaces of stainless-steel upper and lower panels 1 and 2 which are to be bonded with flanges 4 of frame 3. The flanges 4 that are to be bonded to the panels 1 and 2 are given coarse surfaces 7 in a honing process. Note that the difference from the constitution of a conventional card-type electronic device as shown in FIG. 3 is that a recessed area 10 for an electronic part 9 is formed on a substrate 8 by a half-etching of the upper and lower panels 1 and 2.

Figure 1:
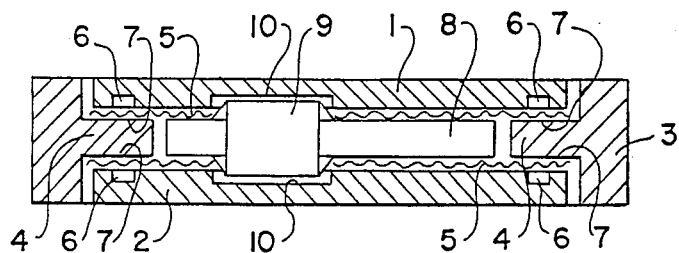
FIG. 1 is a vertical sectional view of one of the preferred embodiments of the card-type electronic device related to the present invention.
Figure 2:
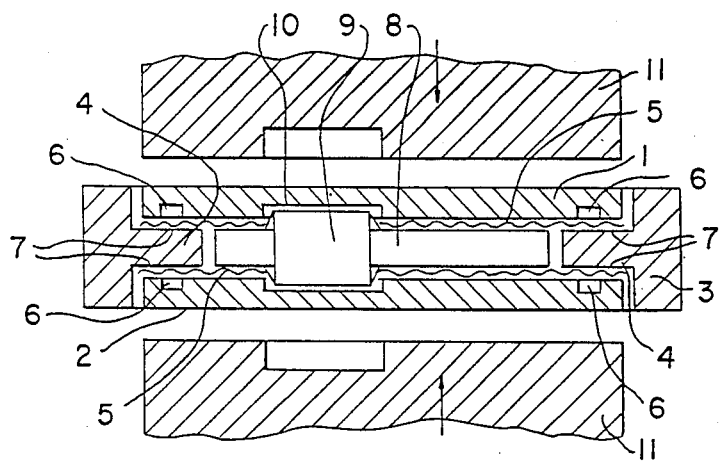
FIG. 2 is a vertical sectional view denoting the production process of the card-type thin electronic device shown in FIG. 1.

Referring now to FIG. 2, the bonding process applicable to the component parts shown in FIG. 1 is described below. A sheet-like thermoplastic bonding agent 5 cut in the designated shape is first thermally adhered by a heater head 11 to the upper and lower panels 1 and 2. Then the panels 1 and 2 are placed facing each other on either side of the frame 3. Finally, the heater head 11 of a thermal adhesion system is again applied to bond the panels to the frame. This thermal adhesion process forces the bonding agent 5 into the grooves 6 so that the bonding agent 5 adheres solidly to the coarse surfaces of the grooves 6 formed by the half-etching process. Also it adheres to the coarse surfaces 7 generated by the honing process on the flanges 4 of the frame 3. This generates a sufficient amount of bonded force to make unnecessary any preliminary treatment of the surfaces to be bonded together. The bonding agent 5 forced into the grooves 6 functions as a cushion against compressive and tensile forces. In addition, since the bonding agent 5 itself is quite elastic, it also provides a great bending strength, thereby preventing any deviation in the positions of panels 1 and 2. An electronic part 9 projecting from the substrate 8 is then inserted into the recessed area 10 formed together with the grooves 6 by the half-etching process. The contact of this electronic part 9 with the panels 1 and 2 ensures that the panels 1 and 2 and the flanges 4 are fully and completely bonded. In the conventional method, the thicknesses of the upper and lower panels are made one-half that of those used in the present invention. This results in a lower bending strength. Note that, even when the recessed area 10 is not formed, the grooves 6 can be formed at the time of applying the half-etching process to the upper and lower panels 1 and 2 without requiring an additional process to form these grooves 6.

As described above, the card-type thin electronic device according to the preferred embodiment of the present invention provides grooves in the surfaces of the upper and lower panels that are to be bonded against the frame. The bonding agent that enters into these grooves and solidly adheres to the coarse surfaces of the panels and functions as a cushion against both compressive and tensile forces. As a result, the present invention provides an extremely large bending strength. Furthermore, since a sufficient bonding force can be generated without applying a preliminary treatment to all the surfaces to be bonded together, manufacturers can dispense with the complicated, manual primer coating process and thereby achieve drastic cost saving. In addition, since the bonding agent goes into the grooves and does not leak outside, the commercial value of the product is maintained. Lastly, since the card-type thin electronic device reflecting the present invention features a simple construction in which only grooves need to be provided, the product can be manufactured at low cost.

While only certain embodiments of the present invention have been described, it will be apparent to those skilled in the art that various changes and modifications may be made therein without departing from the spirit and scope of the present invention as claimed.

What is claimed is:

1. A card-type thin electronic device comprising:
   a frame having a center opening therein,
   flanges on said frame extending into said opening,
   an upper panel located in said opening above upper surfaces of said flanges,
   a lower panel located in said opening below lower surfaces on said flanges,
   bonding means between a lower surface of said upper panel and said upper surfaces of said flanges and between an upper surface of said lower panel and said lower surfaces of said flanges so that said panels are bonded to said flanges, said bonding means includes a sheet-like thermoplastic bonding agent covering said lower surface of said upper panel and a sheet-like thermoplastic bonding agent covering said upper surface of said lower panel, and
   grooves formed in the surfaces of said panels bonded by said bonding agent to said flanges located such that said bonding agent enters said grooves.

2. The card-type thin electronic device defined in claim 1 wherein said surfaces of said flanges have a coarse finish.

3. The card-type thin electronic device defined in claim 1 wherein a recess is located in said lower surface of said upper panel and a corresponding recess is located in said upper surface of said lower panel.

4. The card-type thin electronic device defined in claim 1 wherein an electronic part is positioned in said recesses.

5. The card-type thin electronic device defined in claim 1 wherein said grooves have coarse surfaces.

* * * * *